United States Patent [19]

Nishitani

[11] Patent Number: 4,553,152

[45] Date of Patent: Nov. 12, 1985

[54] MONOLITHIC INFRARED RAY CHARGE TRANSFER ELEMENT

[75] Inventor: Kazuo Nishitani, Itami, Japan

[73] Assignee: Mitsubishi Denki Kabushiki Kaisha, Tokyo, Japan

[21] Appl. No.: 548,755

[22] Filed: Nov. 4, 1983

[30] Foreign Application Priority Data

Nov. 6, 1982 [JP] Japan .................................. 57-195441

[51] Int. Cl.[4] ........................................... H01L 29/78
[52] U.S. Cl. ........................................ 357/24; 357/30; 357/31; 357/16; 357/15
[58] Field of Search ............ 357/30 B, 24 M, 24 LR, 357/31, 24, 30 G, 30 D, 30 I, 30, 16, 15, 24 R

[56] References Cited

U.S. PATENT DOCUMENTS

| | | | |
|---|---|---|---|
| 3,873,836 | 3/1975 | Greene | 357/24 X |
| 3,883,437 | 5/1975 | Nummedal et al. | 357/24 X |
| 4,079,507 | 3/1978 | King | 357/59 X |
| 4,273,596 | 6/1981 | Gutierrez et al. | 357/30 X |
| 4,275,407 | 6/1981 | Lorenze, Jr. | 357/30 |
| 4,422,091 | 12/1983 | Liu | 357/24 LR |
| 4,488,165 | 12/1984 | Levine | 357/30 |

OTHER PUBLICATIONS

Deyhimy, "GaAs CCD," IEEE Electronics and Aerospace Systems Conventions, Arlington, VA (Sep. 29–Oct. 10, 80) pp. 151–154.

Pawlikowski, "Some Properties of Photovoltaic $Cd_xHg_{1-x}Te$ Detectors for Infrared Radiation," *Infrared Physics*, vol. 15, No. 4, pp. 331–337.

Primary Examiner—Andrew J. James
Assistant Examiner—William A. Mintel
Attorney, Agent, or Firm—Sughrue, Mion, Zinn, Macpeak & Seas

[57] ABSTRACT

A monolithic infrared ray charge transfer element suitable for use in the 8 to 14 μm wavelength range, having improved response characteristics, and which is easily fabricated. A charge transfer element is formed on a semiconductor substrate and a semiconductor layer formed on the substrate. An infrared ray detecting element is formed upon the semiconductor layer using a different semiconductor material from that of the semiconductor layer. Preferably, the substrate and semiconductor layer are formed of gallium arsenide and the infrared ray detecting element of mercury cadmium telluride or lead tin telluride.

6 Claims, 2 Drawing Figures

MONOLITHIC INFRARED RAY CHARGE TRANSFER ELEMENT

BACKGROUND OF THE INVENTION

The present invention relates to a monolithic infrared ray charge transfer element for use in an infrared ray image device.

To realize a charge transfer element operating at infrared-ray wavelengths in a range of 3 to 5 μm, there has presently been developed only one element of the monolithic type, i.e., the so-called monolithic silicon Schottky-type infrared charge transfer element.

On the other hand, for a wavelength range of 8 to 14 μm, which is very important commercially, mercury cadmium telluride ($Hg_{1-x} Cd_x Te$: x-0.2) and lead tin telluride ($Pb_{1-x} Sn_x Te$: x-0.2) have been considered as important materials since these materials have high sensitivity for infrared in the 8 to 14 μm wavelength range. These materials, however, generally are not stable compared with silicon or gallium arsenide, which have been widely used in the semiconductor industry. Particularly, mercury cadmium telluride is thermally unstable and mechanically very weak. Lead tin telluride has a very high dielectric constant. Therefore, it has been difficult to produce a charge transfer device using either of these materials. Moreover, devices fabricated from either material exhibit poor transfer characteristics. For these reasons, these materials have not been used for monolithic infrared charge transfer elements. Their use generally has been restricted to ordinary, nonmonolithic infrared ray detecting elements.

To realize a charge transfer element using either of these materials, a hybrid combination of an infrared detecting element of mercury cadmium telluride and a charge transfer element fabricated from silicon has been proposed. In such a hybrid combination, however, it is necessary to electrically connect these elements. Techniques for making such connections are very complicated, and may result in a high parasitic capacitance and/or parasitic inductance which adversely affects characteristics of the resultant element.

SUMMARY OF THE INVENTION

The invention was made in view of the aforementioned state of art, and an object thereof is thus to provide a monolithic infrared charge transfer element which can be easily fabricated and which has improved characteristics.

The above and other objects are achieved according to the present invention by monolithically integrating an infrared detecting element and a charge transfer element by forming on a first semiconductor layer in which the charge transfer element is formed a second semiconductor layer of a different material from that of the first semiconductor layer. The infrared ray detecting element is formed in the second semiconductor layer.

DESCRIPTION OF THE PREFERRED EMBODIMENTS

Figure 1:
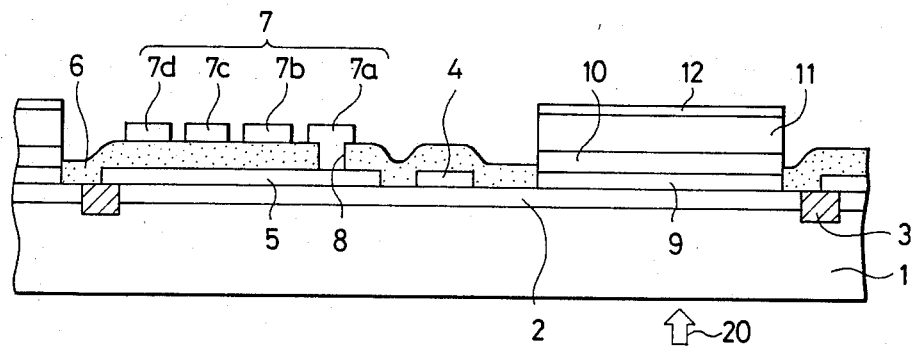
FIG. 1 is a cross-sectional view of a preferred embodiment of a monolithic infrared charge transfer element constructed according to the present invention.
Figure 2:
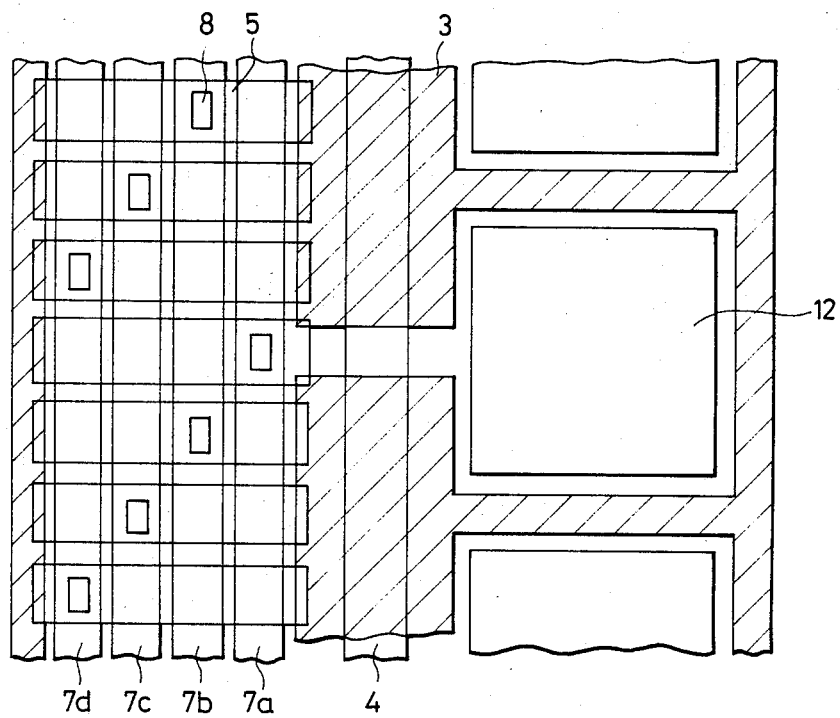
FIG. 2 is a plan view of the element of FIG. 1.

FIGS. 1 and 2 show, in cross-sectional and plan views, respectively, an embodiment of a monolithic infrared charge transfer element which includes a charge transfer section and an infrared ray detecting portion. The latter is constituted by gallium arsenide and mercury cadmium telluride, respectively. More specifically, an n-type gallium arsenide layer 2 is formed on a semi-insulating gallium arsenide substrate 1. A p-type gallium arsenide or semi-insulating gallium arsenide region 3 is formed in the n-type gallium arsenide layer 2. A single elongated transfer gate 4 and a plurality of charge transfer gates 5 are formed on the surface of the layer 2 as shown, and these are covered by an insulating layer 6. On the insulating layer 6, a signal line portion 7 is formed. The signal line portion 7 includes first to fourth signal lines 7a to 7d, respectively. A plurality of contact holes 8 are formed in the insulating layer 6 through which the signal lines 7a to 7d are connected to the charge transfer gates 5.

Also on the n-type gallium arsenide layer 2, a plurality of n-type cadmium telluride layers 9 are formed, on each of which an n-type mercury cadmium telluride layer 10, p-type mercury cadmium telluride layer 11 and electrode 12 in ohmic contact with the p-type mercury cadmium telluride layer 11 are formed, in the stated order, to form infrared detecting portions.

The monolithic infrared charge transfer device described above may be fabricated as follows:

On the semi-insulating gallium arsenide substrate 1, the n-type gallium arsenide layer 2 and the p-type gallium arsenide region 3 are formed by selectively implanting, for example, silicon atoms and beryllium atoms, respectively. The transfer gate 4 and the charge transfer gate 5 are formed thereon by vapor deposition of aluminum, or by photolithographic techniques, to form Schottky barriers. Then, the insulating layer 6 of, for example, silicon nitride ($Si_3N_4$) is formed thereon by plasma chemical vapor deposition (CVD), for instance, after which the layer 6 is suitably patterned by photolithographic techniques.

Next, the signal line portion 7, which is made of aluminum, as formed thereon by vacuum vapor deposition or photolithography such that it electrically contacts the charge transfer gates 5 through the contact holes 8. Thus, the gallium arsenide charge transfer portion is formed.

The infrared ray detecting portion may be formed as will now be described.

The n-type cadmium telluride layer 9, the n-type mercury cadmium telluride 10 and the p-type mercury cadmium telluride layer 11 are selectively formed in the stated order on the n-type gallium arsenide layer 2 by, for instance, molecular beam epitaxy together with the photolithography. Then, the electrodes 12 are formed on the p-type mercury cadmium telluride layer 11 by the vapor evaporation of gold with subsequent photolithographic processing. In the described manner, the infrared detecting portion, composed of the n-type cadmium telluride layer 9, the n-type mercury cadmium telluride layer 10 and the p-type mercury cadmium telluride layer 11, is formed on the n-type gallium arsenide layer 2, which together with the semi-insulating gallium arsenide substrate 1, consititutes the charge transfer element. Thus, an integrated monolithic device including an infrared charge transfer element and infrared detecting element is provided.

In such a monolithic element described above, since the bandgaps of the semi-insulating gallium arsenide substrate 1, the n-type gallium arsenide layer 2 and the n-type cadmium telluride layer 9 are larger than those of the n-type mercury cadmium telluride layer 10 and the p-type mercury cadmium telluride layer 11, it is possible to receive infrared rays from an image being detected on the side of the semi-insulating gallium arsenide substrate 1 as shown by an arrow 20. In this case, electric charge is accumulated between the n-type mercury cadmium telluride layer 10 and the p-type mercury cadmium telluride layer 11. When the transfer gate 4 is opened, the accumulated charge is transferred to the n-type gallium arsenide layer 2 beneath the charge transfer gate 5. Upon application of a signal on the signal line portion 7, the charge is transferred to an output terminal. By applying the thus transferred charge to an external circuit (not shown), an electric signal corresponding to the magnitude of the incident infrared rays can be obtained.

The purpose of providing the p-type or semi-insulating gallium arsenide regions 1 or 3 is to provide separation between adjacent ones of the elements and to transfer charges to portions of the n-type gallium arsenide layer 2 beneath desired ones of the charge transfer gates 5. That is, the regions 3 function as barriers.

According to the embodiment described above, since the infrared ray detecting element is formed on the n-type gallium arsenide layer 2 with which the charge transfer element is formed, by epitaxially growing the mercury cadmium telluride layer by the use of molecular beam epitaxy, a monolithically integrated combination of an infrared ray detecting element and charge transfer element can be easily fabricated. Further, since the infrared ray detecting element is formed with mercury cadmium telluride, which is highly sensitive to infrared rays, the detection sensitivity of the monolithic element to infrared rays is much improved while providing a high transfer efficiency with the gallium arsenide charge transfer element. Furthermore, since there is no need of providing electrical connection between the elements, as was a requirement in the conventional hybrid device, the effects of parasitic capacitance and parasitic inductance are negligible, and thus the important characteristics of the monolithic element are much improved.

It should be noted that, although a gallium arsenide substrate is used in the described embodiment, it is possible to use other materials such as silicon for the substrate provided that the charge transfer element can be formed by using such material. Further, it is possible to form the infrared detecting element with materials other than mercury cadmium telluride such as lead tin telluride, which has a large infrared sensitivity.

The n-type cadmium telluride layer 9 formed between the n-type gallium arsenide layer 2 and the mercury cadmium telluride layer 10 may be replaced by an indium antimonide layer, or it may be omitted in some cases. Further, the aluminum layers used to form the transfer gates 4 and the charge transfer gates 5 may be replaced by other metals such as platinum, or the gates may be formed as MIS gates. Further, the conductivity types of the materials forming the various portions of the respective elements may be reversed. In addition, it is possible to receive the infrared rays on the side of the electrodes 12 if the electrodes are optically transparent.

As mentioned hereinbefore, according to the present invention, a monolithic infrared charge transfer element can be easily fabricated by forming the charge transfer element on an infrared detecting element. Since the important characteristics of the monolithic element are much improved, it is suitable for use as an infrared image device.

I claim:

1. A monolithic infrared ray charge transfer element comprising: a semiconductor substrate, a semiconductor layer formed on said semiconductor substrate, a charge transfer element consisting of Schottky barrier transfer gates formed directly on a first area of said semconductor layer, signal line conductors contacting said gates, and an infrared detector element directly formed on a second area of said semiconductor layer; wherein said semiconductor layer is formed of a material selected from the group consisting of gallium and silicon and said infrared ray detecting element is formed of a layer of cadmium telluride and of a material selected from the group consisting of mercury cadmium telluride and lead tin telluride, said material is formed on said layer of cadmium telluride which in turn is formed on said second area of said semiconductor layer.

2. The monolithic infrared ray charge transfer element as claimed in claim 1, wherein said semiconductor substrate is formed of gallium arsenide, said semiconductor layer is formed of gallium arsenide of a first conductivity type, and wherein said infrared ray detecting element comprises a first layer formed on said semiconductor layer, said first layer being formed of cadmium telluride of said first conductivity type, a second layer formed on said first layer, said second layer being formed of mercury cadmium telluride of said first conductivity type, and a third layer formed on said second layer, said third layer being formed of mercury cadmium telluride of a second conductivity type.

3. The monolithic infrared ray charge transfer element as claimed in claim 1, wherein said semiconductor substrate is formed of gallium arsenide and said semiconductor layer is formed of gallium arsenide of a first conductivity type, and wherein said infrared ray detecting element comprises a first layer formed on said semiconductor layer, said first layer being formed of indium antimonide of said first conductivity type, a second layer formed on said first layer, said second layer being formed of mercury cadmium telluride of said first conductivity type, and a third layer formed on said second layer, said third layer being formed of mercury cadmium telluride of a second conductivity type.

4. The monolithic infrared ray charge transfer element as claimed in claim 1, wherein said semiconductor substrate is formed of gallium arsenide and said semiconductor layer is formed of gallium arsenide of a first conductivity type, and wherein said infrared ray detecting element comprises a first layer formed on said semiconductor layer, said first layer being formed of mercury cadmium telluride of said first conductivity type, and a second layer formed on said first layer, said second layer being formed of mercury cadmium telluride of a second conductivity type.

5. The monolithic infrared ray charge transfer element as claimed in claim 1, further comprising a barrier region for preventing charge transfer formed in said semiconductor layer, said infrared ray detecting element being surrounded by said barrier region, said barrier region being adjacent to a surface of said semiconductor layer and of opposite conductivity type compared with said semiconductor layer.

6. The monolithic infrared ray charge transfer element as claimed in claim 1, wherein said semiconductor layer is formed of a material selected from the group consisting of gallium arsenide and silicon, and said infrared ray detecting element is formed on a material selected from the group consisting of mercury cadmium telluride and lead tin telluride, said material is formed on a layer of indium antimonide which in turn is formed on said second area of said semiconductor layer.

* * * * *